(12) United States Patent
Gardner et al.

(10) Patent No.: US 10,593,785 B2
(45) Date of Patent: Mar. 17, 2020

(54) TRANSISTORS HAVING ULTRA THIN FIN PROFILES AND THEIR METHODS OF FABRICATION

(71) Applicant: Intel Corporation, Santa Clara, CA (US)

(72) Inventors: Sanaz K. Gardner, Hillsboro, OR (US); Willy Rachmady, Beaverton, OR (US); Van H. Le, Portland, OR (US); Matthew V. Metz, Portland, OR (US); Seiyon Kim, Portland, OR (US); Ashish Agrawal, Hillsboro, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/771,998

(22) PCT Filed: Dec. 22, 2015

(86) PCT No.: PCT/US2015/067449
§ 371 (c)(1),
(2) Date: Apr. 27, 2018

(87) PCT Pub. No.: WO2017/111958
PCT Pub. Date: Jun. 29, 2017

(65) Prior Publication Data
US 2018/0226496 A1 Aug. 9, 2018

(51) Int. Cl.
*H01L 29/78* (2006.01)
*H01L 29/66* (2006.01)
(Continued)

(52) U.S. Cl.
CPC ........ *H01L 29/66818* (2013.01); *B82Y 10/00* (2013.01); *H01L 21/0243* (2013.01);
(Continued)

(58) Field of Classification Search
CPC ..... H01L 29/26; H01L 29/267; H01L 29/785; H01L 29/66795; H01L 29/66818
See application file for complete search history.

(56) References Cited

U.S. PATENT DOCUMENTS

| 8,264,032 B2 | 9/2012 | Yeh et al. |
| 2013/0168771 A1 | 7/2013 | Wu et al. |

(Continued)

FOREIGN PATENT DOCUMENTS

| JP | 2011-061196 | 3/2011 |

OTHER PUBLICATIONS

International Search Report and Written Opinion for International Patent Application No. PCT/US2015/067449 dated Sep. 20, 2016, 13 pgs.

(Continued)

*Primary Examiner* — Tucker J Wright
*Assistant Examiner* — Scott Stowe
(74) *Attorney, Agent, or Firm* — Schwabe, Williamson & Wyatt, P.C.

(57) ABSTRACT

A transistor having an ultra thin fin profile and its method of fabrication is described. The transistor comprises a semiconductor substrate having an insulation layer formed on a semiconductor substrate. A fin extends from the semiconductor substrate. The fin has a subfin portion on the semiconductor substrate and an active fin portion on the subfin portion. The subfin portion is disposed in a trench formed in the insulation layer. The subfin portion comprises a III-V semiconductor material and the active fin portion comprises a group IV semiconductor material.

25 Claims, 13 Drawing Sheets

(51) Int. Cl.
| | |
|---|---|
| H01L 29/10 | (2006.01) |
| B82Y 10/00 | (2011.01) |
| H01L 29/775 | (2006.01) |
| H01L 21/8238 | (2006.01) |
| H01L 21/02 | (2006.01) |
| H01L 21/306 | (2006.01) |
| H01L 27/092 | (2006.01) |
| H01L 29/267 | (2006.01) |
| H01L 29/06 | (2006.01) |
| H01L 29/16 | (2006.01) |
| H01L 29/20 | (2006.01) |

(52) U.S. Cl.
CPC .. *H01L 21/02381* (2013.01); *H01L 21/02461* (2013.01); *H01L 21/02463* (2013.01); *H01L 21/02532* (2013.01); *H01L 21/02543* (2013.01); *H01L 21/02546* (2013.01); *H01L 21/02639* (2013.01); *H01L 21/30604* (2013.01); *H01L 21/823821* (2013.01); *H01L 27/0924* (2013.01); *H01L 29/107* (2013.01); *H01L 29/1079* (2013.01); *H01L 29/267* (2013.01); *H01L 29/66439* (2013.01); *H01L 29/66469* (2013.01); *H01L 29/66522* (2013.01); *H01L 29/775* (2013.01); *H01L 29/785* (2013.01); *H01L 29/7854* (2013.01); *H01L 21/30612* (2013.01); *H01L 21/30625* (2013.01); *H01L 29/0673* (2013.01); *H01L 29/16* (2013.01); *H01L 29/20* (2013.01)

(56) References Cited

U.S. PATENT DOCUMENTS

| | | |
|---|---|---|
| 2013/0234147 A1* | 9/2013 | Wu ................ H01L 29/66795 257/76 |
| 2014/0064312 A1 | 3/2014 | Lee et al. |
| 2014/0264607 A1 | 9/2014 | Basu et al. |
| 2015/0279947 A1 | 10/2015 | Waldron et al. |

OTHER PUBLICATIONS

International Preliminary Report on Patentability for PCT Patent Application No. PCT/US2015/067449 dated Jul. 5, 2018, 10 pgs.

* cited by examiner

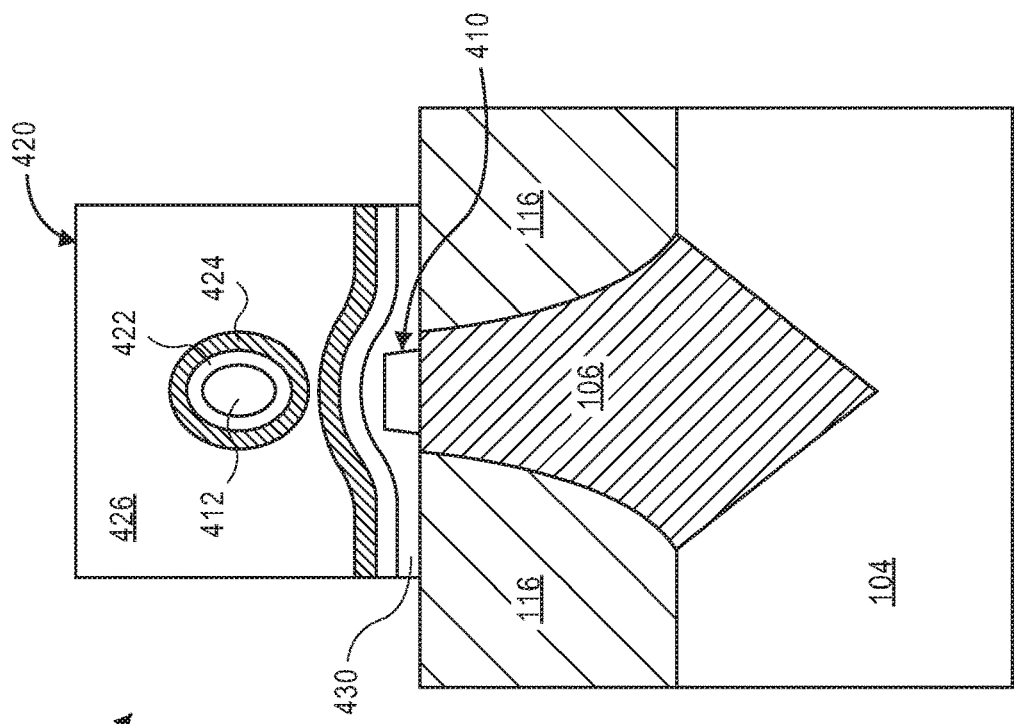
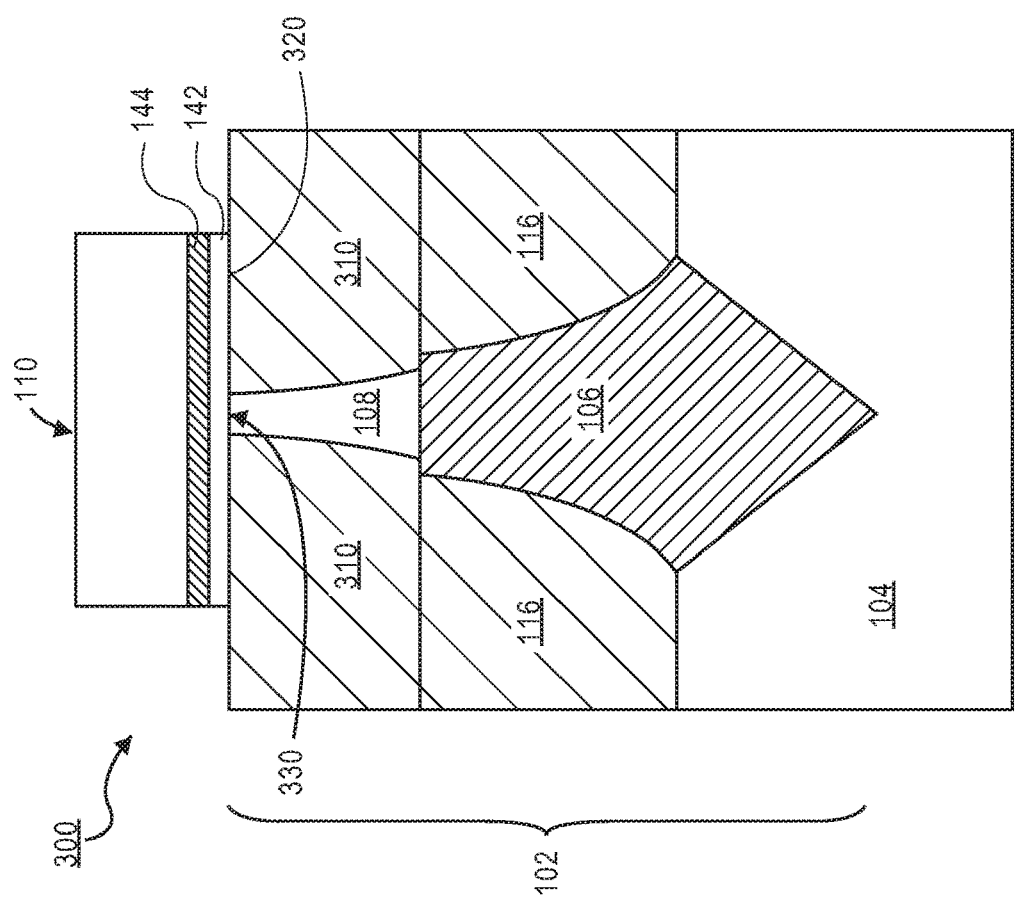

TRANSISTORS HAVING ULTRA THIN FIN PROFILES AND THEIR METHODS OF FABRICATION

CROSS-REFERENCE TO RELATED APPLICATION

This patent application is a U.S. National Phase Application under 35 U.S.C. § 371 of International Application No. PCT/US2015/067449, filed Dec. 22, 2015, entitled "TRANSISTORS HAVING ULTRA THIN FIN PROFILES AND THEIR METHODS OF FABRICATION," which designates the United States of America, the entire disclosure of which is hereby incorporated by reference in its entirety and for all purposes.

BACKGROUND

1. Field

Embodiments of the present invention are directed to field effect transistors (FETs) having ultra thin active fin profiles and their methods of fabrication.

2. Discussion of Related Art

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Semiconductor devices formed from germanium-based material systems offer exceptionally high hole mobility in the transistor channels due to low effective mass along with reduced impurity scattering. Such devices provide high drive current performance and appear promising for future low power, high speed logic applications. However, significant improvements are still needed in the area of germanium-based devices.

Additionally, in the manufacture of integrated circuit devices, multi-gate transistors, such as tri-gate transistors, or gate-all-around devices, such as nanowires, have become more prevalent as device dimensions continue to scale down. Many different techniques have been attempted to reduce channel or external resistance of such transistors. However, significant improvements are still needed in the area of channel or external resistance suppression. Also, many different techniques have been attempted to manufacture devices with non-Si channel materials such as SiGe, Ge, and III-V materials. However, significant process improvements are still needed to integrate these materials on Si wafers.

BRIEF DESCRIPTION OF THE DRAWINGS

FIG. 3 is a cross-sectional illustration of a planar field effect transistor in accordance with embodiments of the present invention.

FIG. 4 is a cross-sectional illustration of a nanowire device in accordance with embodiments of the present invention.

DESCRIPTION OF THE EMBODIMENTS

Figure 1A:
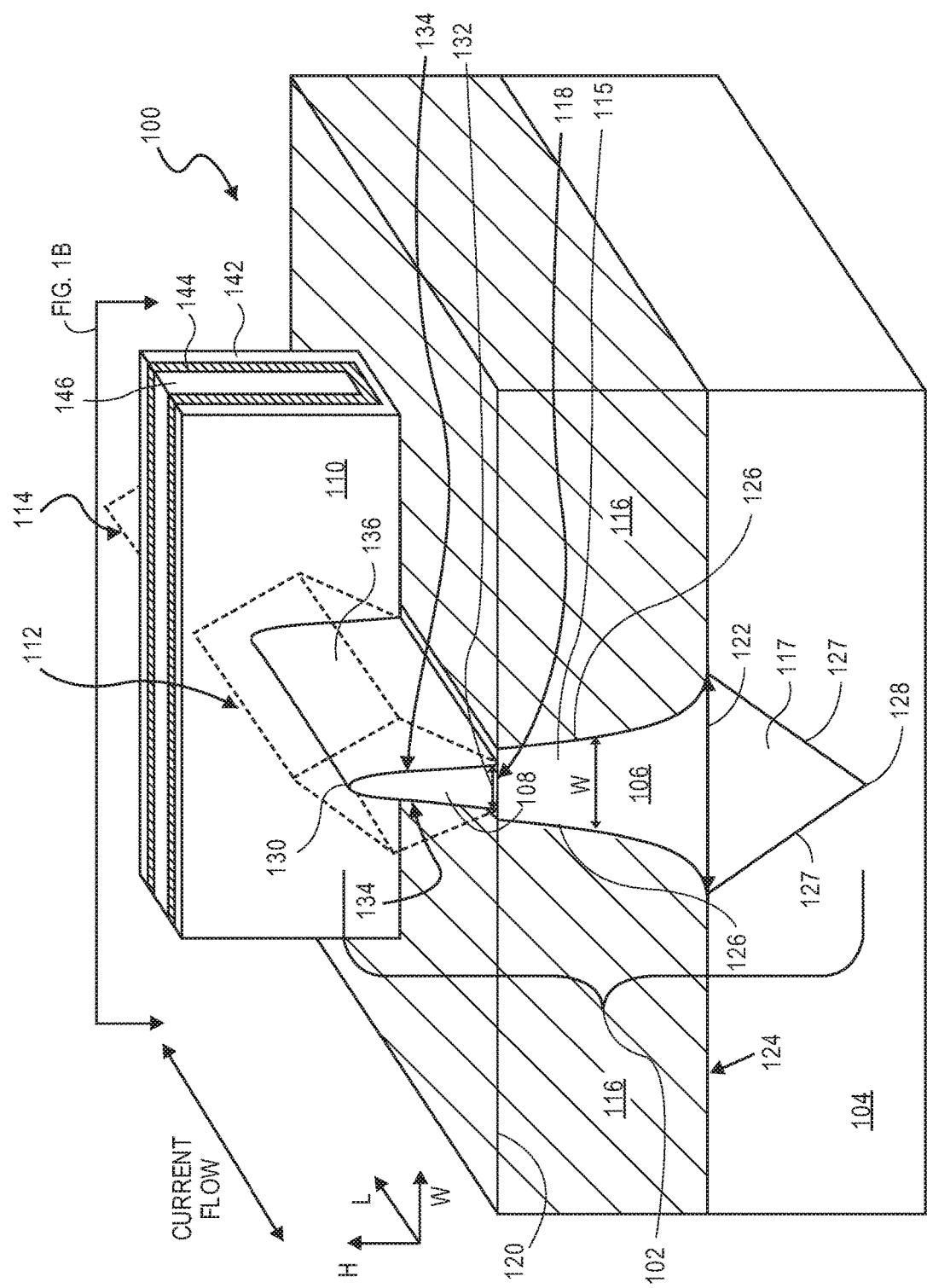
FIG. 1A is an angled view illustration of a field effect transistor in accordance with embodiments of the present invention.

Embodiments of the present invention are directed to field effect transistors having ultra thin fin profiles and their methods of fabrication. In the following description, numerous specific details are set forth in order to provide a thorough understanding of embodiments of the present invention. In other instances, well-known semiconductor device concepts and techniques have not been described in detail in order to not unnecessarily obscure embodiments of the present invention.

Embodiments of the present invention are directed to field effect transistors having ultra thin fin profiles. The transistors of embodiments of the present invention may include a fin having a subfin portion and an active fin portion. The subfin portion is disposed in an insulation layer, such as a shallow trench isolation layer, formed on a substrate. The active fin portion is disposed on the subfin portion and extends above a top surface of the insulation layer. A gate stack is formed over the active fin portion, and source and drain regions are disposed on opposite sides of the gate stack. The active fin portion is thinner than the subfin portion in order to create a transistor with improved electrostatics. In an embodiment of the present invention, the active fin portion has a thin active fin portion having a width which is less than the minimal width or critical dimension (CD) which can be lithographically defined for the processing node used to fabricate the integrated circuit in which the transistor is included. In a specific embodiment of the present invention, the active fin portion is a group IV semiconductor, such as germanium, and the subfin portion is a III-V semiconductor, such as a gallium arsenide (GaAs) formed on a single crystalline silicon substrate. In an embodiment of the present invention, the transistor is a P-type transistor. The transistors of embodiments of the present invention may be planar transistors, multi-gate transistors, such as trigate transistors and double gate transistors, or gate all around transistors, such as nanowires.

In embodiments of the present invention, transistors may be fabricated by forming a trench in an insulation layer, such as in a shallow trench isolation layer, disposed on a semiconductor substrate, such a silicon substrate. The trench has a high aspect ratio (depth:width), such as at least 2:1, to provide an aspect ratio trapping (ART) trench. A subfin semiconductor material, such as GaAs, may then be grown in the ART trench. In an embodiment of the present invention, the III-V semiconductor material is grown until it completely fills the trench and extends above the top surface of the insulation layer. The portion of the III-V semiconductor material extending above the insulation layer can then be removed by, for example, chemical mechanical polishing (CMP). Since the III-V semiconductor material is grown in an ART trench, defects, such as threading dislocations, due the lattice mismatch between the semiconductor substrate and the III-V semiconductor material terminate on the sidewalls of the insulation layer, within the ART trench. In this way, a subfin portion may be grown that has an uppermost portion which is pristine and defect free. Next, the top portion of the subfin may be recessed below the top surface of the insulation layer. The active fin semiconductor material is then grown on the top surface of the subfin, within the ART trench. In an embodiment of the present invention, the active fin semiconductor material is grown until it extends above the top surface of the insulation layer. In one embodiment, the active fin semiconductor material is a group IV semiconductor, such as germanium. In an embodiment of the present invention, the active fin semiconductor material is lattice matched with the subfin semiconductor material. The portion of the active semiconductor material which extends above the insulation layer can then be removed by, for example, CMP. Next, the insulation layer may be recessed by, for example, etching to reveal sidewalls of the active fin portion. The resulting exposed active fin portion may then laterally etched by, for example, wet etching in order decrease the lateral width of the exposed active fin portion. A gate stack can then be formed over the thinned active fin portion, and source and drain regions may be formed on opposite sides of the gate electrode in order to complete fabrication of the transistor.

Overall, in an embodiment, a subfin portion is first formed in an ART trench to provide a substantially defect free surface of the subfin portion. An active fin may then be grown on the substantially defect free surface of the subfin portion, within the ART trench. The insulation layer of the ART trench may then be recessed to reveal a height quality, substantially defect free active fin portion. The revealed active fin portion may then be thinned to provide an ultrathin fin profile. Since the active fin portion has been grown on a pristine defect free surface of the subfin, the active fin portion is a high quality defect free semiconductor material. Additionally, by laterally wet etching the active fin portion any defects or damage on the sidewalls of the active fin portion due to processing are removed. Additionally, embodiments of the present invention enable ultrathin active fin portions having widths which are less than the minimum dimension or critical dimension (CD) that can be photolithographically defined for the process node used to fabricate the integrated circuit in which transistors having the ultrathin active fin portions are included.

Figure 1B:
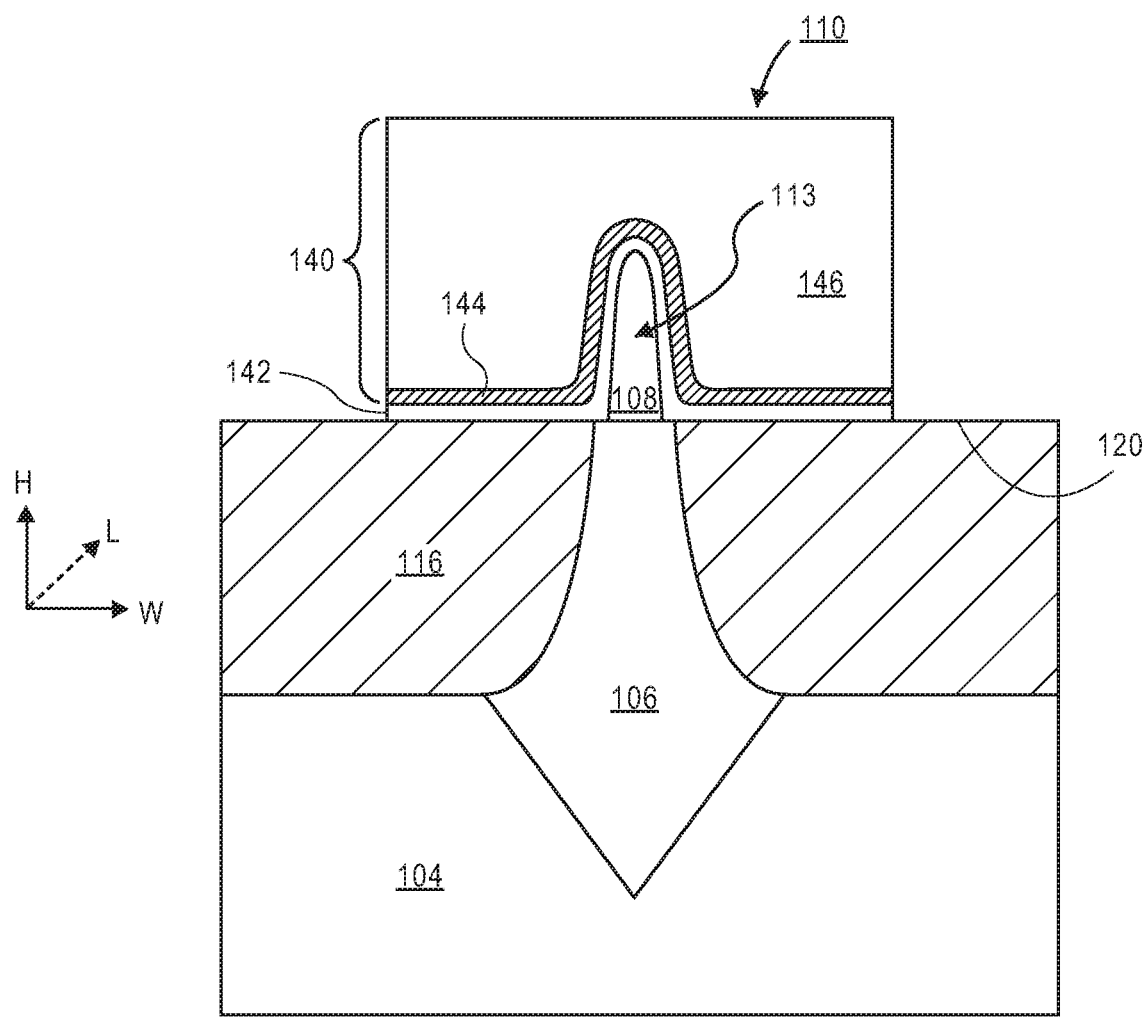
FIG. 1B is a cross-sectional illustration of the field effect transistor of FIG. 1A taken through the gate electrode and channel region of the field effect transistor of FIG. 1A.

FIG. 1A is an angled view illustration of a field effect transistor 100 in accordance with an embodiment of the present invention. FIG. 1B is a cross-sectional view of transistor 100 taken through the gate electrode and the channel region of the transistor. Transistor 100 includes a fin 102 extending from a substrate 104. Fin 102 has a subfin portion 106 and an active fin portion 108. A gate stack 110 is formed on active portion 108. A source region 112 and a drain region 114 are disposed on opposite sides of gate stack 110. As illustrated in FIG. 1B, fin 102 has a channel region 113 located beneath gate stack 110 and between source region 112 and drain region 114. Current flows from the source region 112 through the channel region 113 to the drain region 114 when the transistor is "ON". Fin 102 has a width (W) which is perpendicular to the direction of current flow, and length (L) which parallel to the direction of current flow and a height (H) which is measured from the bottom of the subfin portion 106 to the top of active fin portion 108.

In an embodiment of the present invention, the subfin 106 has a trench portion 115 and substrate portion 117. The trench portion 115 is disposed in an ART trench in an insulation layer 116, such as in a shallow trench isolation (STI), disposed on substrate 104. The substrate portion 117 is disposed in the substrate 104, beneath the insulation layer 116. In an embodiment, subfin portion 106 may have a top surface 118 which is substantially coplanar with a top surface 120 of insulation layer 116, as illustrated in FIGS. 1A and 1B.

Figure 1C:
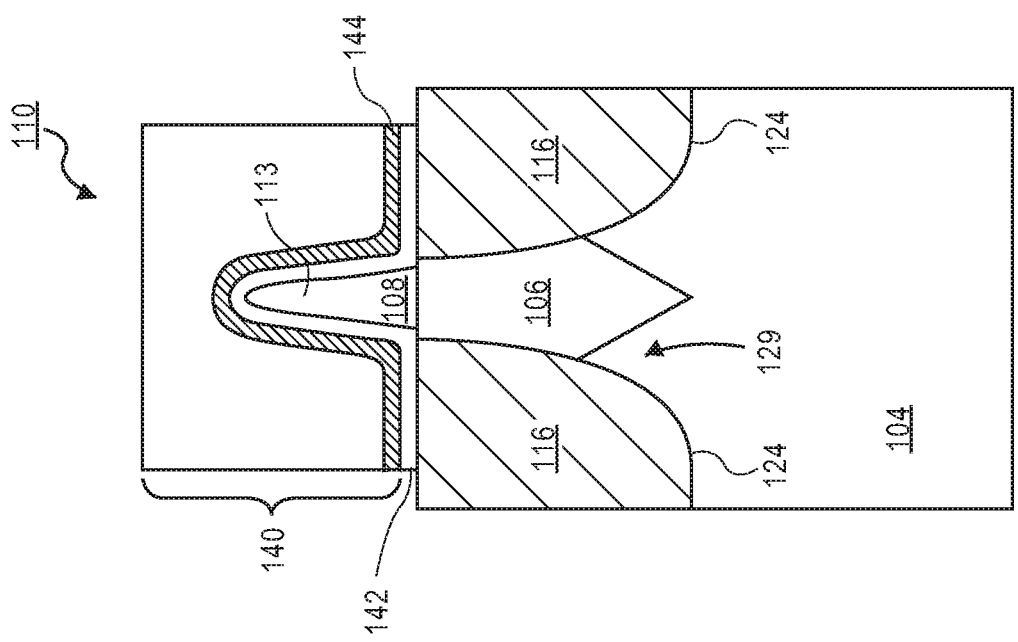
FIG. 1C is a cross-sectional illustration of a field effect transistor having a subfin extending above an insulation layer in accordance with embodiments of the present invention.

In another embodiment, as shown in FIG. 1C, subfin 106 may have a portion 107 which slightly extends above the top surface of insulation layer 116, such as extending approximately 3 nanometers above the top surface of insulation layer 116. Such an arrangement ensures full exposure of the active fin portion to gate control.

In an embodiment, trench portion 115 has a bottom 122 which is substantially coplanar with an interface 124 formed by the bottom of insulation layer 116 and the top of substrate 104. In an embodiment, the bottom 122 of trench portion 115 in the insulation layer 116 is wider than the top 118 of the subfin portion 106. A wider bottom 122 makes the fin 102 more stable and more manufacturable. In an embodiment, the bottom 122 of substrate insulation portion 115 is between 10-50% wider than the top surface 118 of subfin 106. In an embodiment, the sidewalls 126 of trench portion 106 are gradually and continually tapered inward from the bottom 122 to the top 118. In an embodiment, the trench portion 115 of subfin 106 has an aspect ratio (height:width) of at least 2:1, and in other embodiments of at least 3:1, where the width is taken at the mid-point between the bottom 122 and the top 118.

In an embodiment of the present invention, substrate portion 117 of subfin 106 is disposed in a faceted trench formed in substrate 104. In an embodiment, the faceted trench has a "V" shape along the width of the fin 102, such that the sidewalls 127 taper inwardly from the interface 124 to a vertex 128 deeper into the substrate 104. In an embodiment of the present invention, faceted sidewalls 127 are the <111> planes of a (100) monocrystalline silicon substrate or wafer. The resulting subfin 106 has a lower portion 117 that takes the form of the faceted trench and tapers to a bottom-most point at vertex 128. In an embodiment, the vertical distance from the interface 124 to the vertex 128 is no less than approximately 25% of the total subfin 106 height, but no more than approximately 50% of the total subfin 106 height. In another embodiment, the vertical distance from the interface 124 to the vertex 128 is less than 25% of the total subfin 106 height.

Figure 1D:
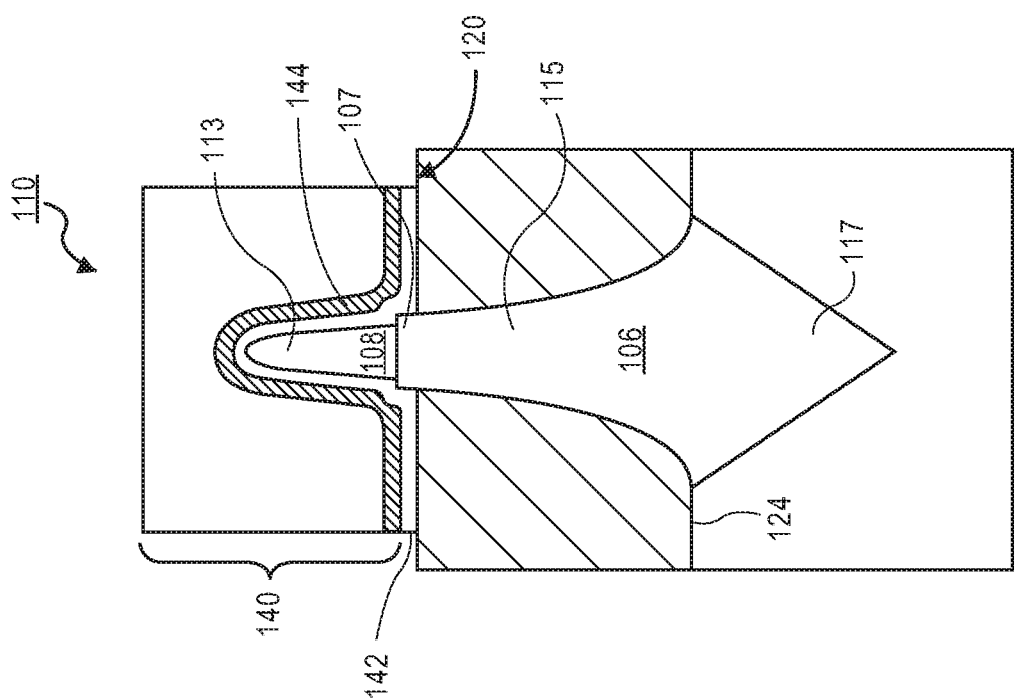
FIG. 1D is a cross-sectional illustration of a field effect transistor having a bottom portion of a subfin located within an insulation layer in accordance with embodiments of the present invention.

In an embodiment of the present invention, as illustrated in FIG. 1D, the subfin 106 may have only a trench portion 115 and not a substrate portion 117. In an embodiment of the present invention, trench portion 115 of subfin 106 may be formed in a faceted trench or "V" shaped trench formed in a substrate portion 129 of substrate 104 located between the insulation layer 116. In another embodiment, the bottom 128 of the faceted trench is substantially coplanar with interface 124, as shown in FIG. 1D. In an embodiment, bottom 128 may be slightly higher than interface 124. Remaining portions of the substrate 129 located between the insulation layer 116, above the interface 124, have a profile that flares outward as it approaches the bottom of the insulation layer 116 and that is faceted along the V-shaped trench.

In an embodiment, subfin 106 is fabricated from a different semiconductor material than substrate 104. In an embodiment, the entire subfin 106 is a homogeneous body formed from a single semiconductor material. In another alternative embodiment, substrate 104 may be composed of different semiconductor materials in order to provide, for example, buffer layers, grading, or desired electrical characteristics. In another alternative embodiment, the subfin 106 is formed from a III-V semiconductor material, such as but not limited to GaAs, AlAs, GaAsP, and GaInP. In a specific embodiment, the subfin semiconductor material is GaAs.

Active fin portion 108 has a top 130 and a bottom 132 formed directly on a top surface 118 of subfin 106, and a pair of laterally opposite sidewalls 136 parallel to the length (L) direction of fin 102. In an embodiment, the bottom 132 of active fin portion 108 has a smaller width than the top 118 of subfin 106. In an embodiment, the bottom 132 of active fin portion 108 is between 10-50% narrower than the top 118 of subfin 106. In an embodiment, the height of the active fin portion 108 is approximately 40-80 nanometers, and the width at the mid-point of the height is approximately in the range of 5-15 nanometers. In an embodiment, the bottom 132 of active fin portion 108 is wider than the top 130 of active fin portion 108 and sidewalls 136 taper inwardly from the bottom 132 to the top 130 of active fin portion 108. In an embodiment, active fin portion 108 has a substantially rounded top 130 as shown in FIGS. 1A and 1B. However, in other embodiments, the top 130 of active fin 108 may be substantially planar. In still other embodiments, the top 130 of active fin 108 may have a planar surface with rounded corners. It is to be appreciated that the ultrathin fin profile described above for active fin portion 108 of fin 102 may, in some embodiments, be limited to the channel region 113, i.e., the region under gate stack 110. For example, as will be discussed below, source and drain regions of the active fin portion 108 of fin 102 may be engineered or altogether replaced to fabricate source and drain structures coupled to channel region 113.

In an embodiment of the present invention, the active fin portion 108 is formed from a semiconductor material that has a smaller bandgap than the semiconductor material at the top 118 of subfin 106 (e.g., the active fin portion 108 has a bandgap of at least 0.3 eV less than the bandgap of the semiconductor material at the top 118 of subfin 106). In an embodiment, the active fin semiconductor material is a semiconductor material which is lattice matched to the semiconductor material at the top 118 of subfin 106. In an embodiment of the present invention, the active fin semiconductor material is a group IV semiconductor material, such as Ge and SiGe. In a specific embodiment, the active fin semiconductor material is germanium. As used throughout, the terms germanium, pure germanium or essentially pure germanium may be used to describe a germanium material composed of a very substantial amount of, if not all, germanium. However, it is to be appreciated that, practically, 100% pure Ge may be difficult to form and, hence, could include a tiny percentage of Si. The Si may be included as an unavoidable impurity or component during deposition of Ge or may "contaminate" the Ge upon diffusion during post deposition processing. As such, embodiments described herein directed to a Ge channel may include Ge channels that contain a relatively small amount, e.g., "impurity" level, non-Ge atoms or species, such as Si. In an embodiment of the present invention, the active fin portion 108 is formed from SiGe having at least 80 atomic percent Ge.

In embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

As is well known in the art, source 112 and drain 114 regions are formed adjacent to, and on opposing sides of, the gate stack 110 of each field effect transistor. The source 112 and drain 114 regions are generally formed using either an implantation/diffusion process (e.g., where N-type dopants are implanted/diffused for an N-type device or where P-type dopants are implanted/diffused for a P-type device) or an etching/deposition process. In the former process, dopants such as boron, aluminum, antimony, phosphorous, or arsenic may be ion-implanted into the fin 102 to form the source 112 and drain 114 regions. An annealing process that activates the dopants and causes them to diffuse further into the fin 102 typically follows the ion implantation process. In the latter process, the fin 102 may first be etched to form recesses at the locations of the source 112 and drain 114 regions. An epitaxial deposition process may then be carried out to fill the recesses with material that is used to fabricate the source 112 and drain 114 regions. In some implementations, the source 112 and drain 114 regions may be fabricated using a silicon alloy such as silicon germanium or silicon carbide. In some implementations the epitaxially deposited silicon alloy may be doped in situ with dopants such as boron, arsenic, or phosphorous. In further embodiments, the source 112 and drain 114 regions may be formed using one or more alternative semiconductor materials such as germanium or a group III-V material or alloy. And in further embodiments, one or more layers of metal and/or metal alloys may be used to form the source 112 and drain 114 regions.

In an embodiment of the present invention, source region 112 may include the active portion 108 of fin 102 located on the source side of gate stack 110, and drain region 114 may include the active portion 108 of fin 102 located on the drain side of the gate stack 110. In an embodiment of the present invention, a semiconductor material 136 may be grown on the source and drain portions of the active fin portion 108, in order to enlarge the source 112 and drain 114 portion and thereby reduce contact resistance. In one such embodiment, the semiconductor material 136 may be the same semiconductor material used to form the active fin, e.g., germanium. In an embodiment present invention, the additional semiconductor 136 is epitaxially grown and has faceted surfaces as shown in FIG. 1A. In yet other embodiments, the active fin portion in the source 112 and drain 114 regions may be slightly recessed or even completely removed in order to grow source and drain regions of a different semiconductor material than the active fin portion 108 in order to tailor the electrical characteristics of the transistor or to create a mechanical stress through the channel region 113 of the device. In an embodiment, the active fin portions in the source 112 and drain 114 regions are partially removed or completely removed and then regrown with a semiconductor that creates a compressive stress on the channel region 113 for a P-type device or a tensile stress in the channel region for a N-type device. In an exemplary embodiment, the resulting device is a P-type device having a germanium channel region 113 and uniaxially compressively stressing InGaAs source 112 and drain 114 regions.

In an embodiment, transistor 100 includes gate stack 110 formed on the top 130 and along the sidewalls 134 of the channel region 113 of the active fin portion 108. In an embodiment, the gate stack 110 is formed of at least two layers, a gate electrode layer 140 and a gate dielectric layer 142.

The gate dielectric layer 142 may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer 140 is formed on the gate dielectric layer 142 and may include at least one P-type workfunction metal or N-type workfunction metal, depending on whether the transistor is to be a P-type or an N-type transistor. In some implementations, the gate electrode layer may consist of a stack of two or more metal layers, where one or more metal layers are workfunction metal layers 144 and at least one metal layer is a fill metal layer 146.

For a P-type transistor, metals that may be used for the gate electrode include, but are not limited to, ruthenium, palladium, platinum, cobalt, nickel, and conductive metal oxides, e.g., ruthenium oxide. A P-type metal layer will enable the formation of a P-type gate electrode with a workfunction that is between about 4.9 eV and about 5.2 eV. For an N-type transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an N-type gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack 110 that bracket the gate stack 110. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

One or more interlayer dielectrics (ILD) are deposited over the field effect transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant. Metal layers formed in the ILD may be used to electrically interconnect various transistors 100 formed on substrate 104 into functional integrated circuits, such as but not limited to, microprocessors and memories.

Figure 2:
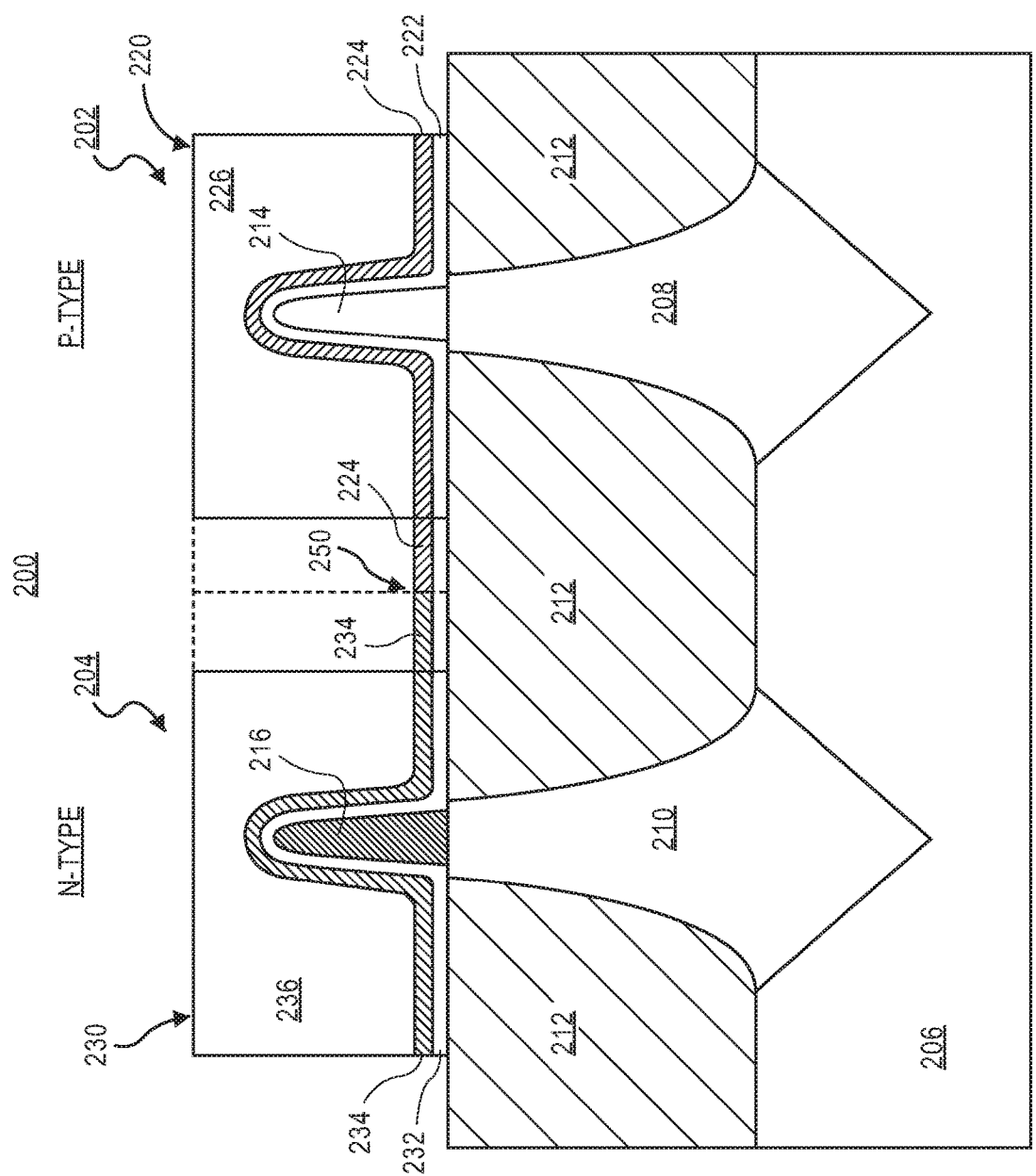
FIG. 2 is a cross-sectional illustration of a CMOS device having an N-type field effect transistor and a P-type field effect transistor in accordance with embodiments of the present invention.

FIG. 2 is a cross-sectional illustration of a CMOS integrated circuit device 200 including a P-type field effect transistor 202 and an N-type field effect transistor 204 in accordance with embodiments of the present invention. The CMOS device 200 includes a substrate 206 and a first subfin 208 and a second subfin 210 formed in an insulation layer 212 as described above. P-type field effect transistor 202 includes an active fin portion 214 formed from a group IV semiconductor material. N-type field effect transistor 204 includes an active fin 216 formed from a III-V semiconductor material. P-type field effect transistor 202 includes a gate stack 220 and N-type field effect transistor includes a gate stack 230. In an embodiment of the present invention, gate stack 220 includes a gate dielectric layer 222, a P-type work function metal 224 and a gate fill material 226. In an embodiment of the present invention, N-type gate stack 230 includes gate dielectric layer 232 and an N-type work function metal 234 and a gate fill material 236. In an embodiment of the present invention, the gate dielectric layer 222 and the gate dielectric layer 232 may be formed from the same gate dielectric material, such as a high-k material. Alternatively, gate dielectric layer 222 and gate dielectric 232 may differ in composition and/or thickness may be formed from different dielectric materials. In an embodiment of the present invention, subfin 208 and subfin 210 are formed from the same III-V semiconductor material. As represented by the dotted line in FIG. 2, the gate stack 220 and the gate stack 230 may be in direct contact with one another. In an embodiment, as depicted in FIG. 2, a vertical or substantially vertical interface 250 is formed where the N-type work function metal 234 of gate stack 230 and the P-type work function metal 224 of gate stack 220 meet over the insulation layer 212. In one such embodiment, a P/N junction is formed at the interface 250.

FIG. 3 is a cross-sectional illustration of a planar field effect transistor in accordance with embodiments of the present invention. Planar transistor 300 includes a fin 102 including a subfin portion 106 formed in an insulation layer 116 formed on a substrate 104 as described above. Additionally, fin 102 includes an active fin portion 108 formed on subfin portion 106. A second insulation layer 310 is formed around and directly adjacent active fin 108 and has a top surface 320 which is planar with a top surface 330 of active fins 108. A gate stack 110 is formed on the top surface 330 of active fin 108 as well as on second insulation layer 310 as shown in FIG. 3. A source region and drain region are formed on opposite sides of gate stack 110 as described above.

FIG. 4 is a cross-sectional illustration of a nanowire device 400 in accordance with embodiments of the present invention. Nanowire device 400 includes subfin portion 106 formed in insulation layer 116 formed on substrate 104 as described above. Nanowire device 400 may include a remainder 410 of an active fin portion and a discrete fin portion 412 above the remainder 410 of the active fin portion. Lower active fin portion 410 is disposed directly on the top surface of subfin 106 as shown in FIG. 4. Discrete active fin portion 412 is completely surrounded by a gate stack 420. Discrete active fin portion 412 provides a channel nanowire for nanowire device 400. The gate stack 420 may include a gate dielectric layer 422 in directed contact with the discrete portion of active fin 412 and a work function metal 424 in direct contact with the gate dielectric 422. Gate stack 420 may further include a fill material 426. An insulation layer 430 may be disposed between remainder 410 of the active fin portion and gate stack 420. Source and drain regions may be formed on opposite sides of gate stack 420 and in direct contact with discrete active fin portion 412. In an embodiment, the discrete active fin portion 412 is a nanowire having a diameter approximately in the range of 2-10 nanometers.

Methods of forming transistors, devices, and integrated circuits in accordance with an embodiment of the present invention are illustrated in FIGS. 5A-5L. In embodiments of the present invention, the method begins by providing a substrate 500. In an embodiment, the substrate 500 is a semiconductor substrate, such as described above. In a specific embodiment, the semiconductor substrate is a monocrystalline silicon substrate. A patterned mask 502 is formed on the substrate. Patterned mask 502 defines locations where sacrificial fins will be formed from substrate 500. In an embodiment, patterned mask 502 is formed from a hard mask material, such as silicon nitride. A patterned hard mask 502 can be formed by any well-known technique.

Figure 5A:
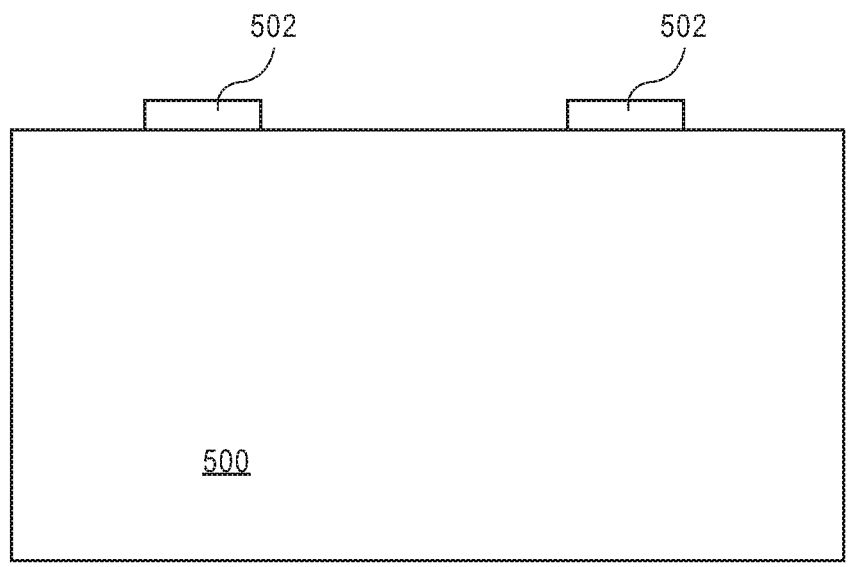
FIGS. 5A-5L are cross-sectional illustrations of various operations in a method of fabricating field effect transistors in accordance with embodiments of the present invention.
Figure 5B:
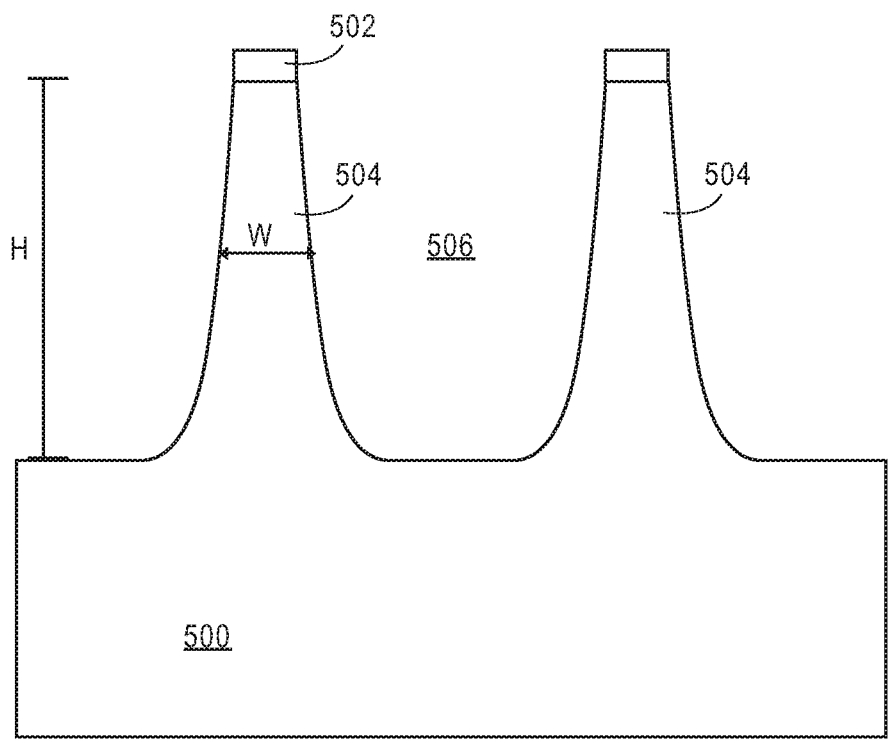

Next, as shown in FIG. 5B, at least one but generally a plurality of sacrificial fins 504 are formed in substrate 500. Fins 504 have a height (H) and a width (W) where the width is the average width of the fin typically taken at the midpoint of height of the fin. In an embodiment, fins 504 have an aspect ratio (H:W) of at least 2:1, generally at least 3:1, and ideally at least 4:1. Sacrificial fins 504 will subsequently be used to define aspect ratio trapping (ART) trenches for the subsequent deposition of semiconductor materials for the formation of regrown semiconductor fins. In an embodiment, as illustrated in FIG. 5B, the bottom or base of fins 504 have a wider width than the top of the fins 504. This enables the subsequent formation of fins having a subfin with a wider base thereby increasing the stability of the fins. Any well-known process can be utilized to form sacrificial fins 504, such as dry etching substrate 500 in alignment with hard mask 502 to create fins 504. When substrate 500 is a silicon substrate, sacrificial fins 504 may be etched utilizing an etch chemistry comprising, e.g., HBr/Cl or $NF_3$.

Figure 5C:
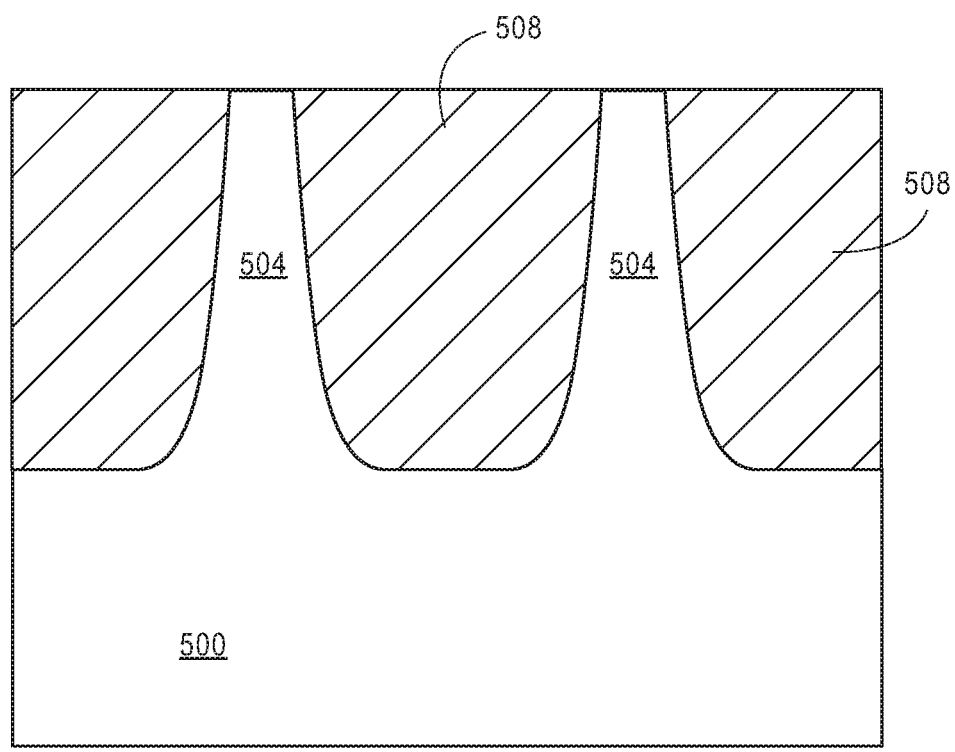

Next, as illustrated in FIG. 5C, an insulation layer 508, such as a shallow trench isolation layer, is blanket deposited over substrate 500 over sacrificial fins 504 and in the gaps 506 between fins 504. The top surface of the insulation layer 508 may then be planarized so that the top surface of sacrificial fins 504 are coplanar with the top surface of insulation layer 508. Insulation layer 508 may be planarized by, for example, chemical mechanical polishing (CMP) or plasma etch back. In an embodiment, a chemical mechanical polishing process is used to planarize insulation layer 508 to remove hard mask 502 so that the top surface of sacrificial fins 504 are planar with the top surface of insulation layer 508. In an alternative embodiment, insulation layer 508 may be planarized to be coplanar with the top surface of hard mask 502.

Figure 5D:
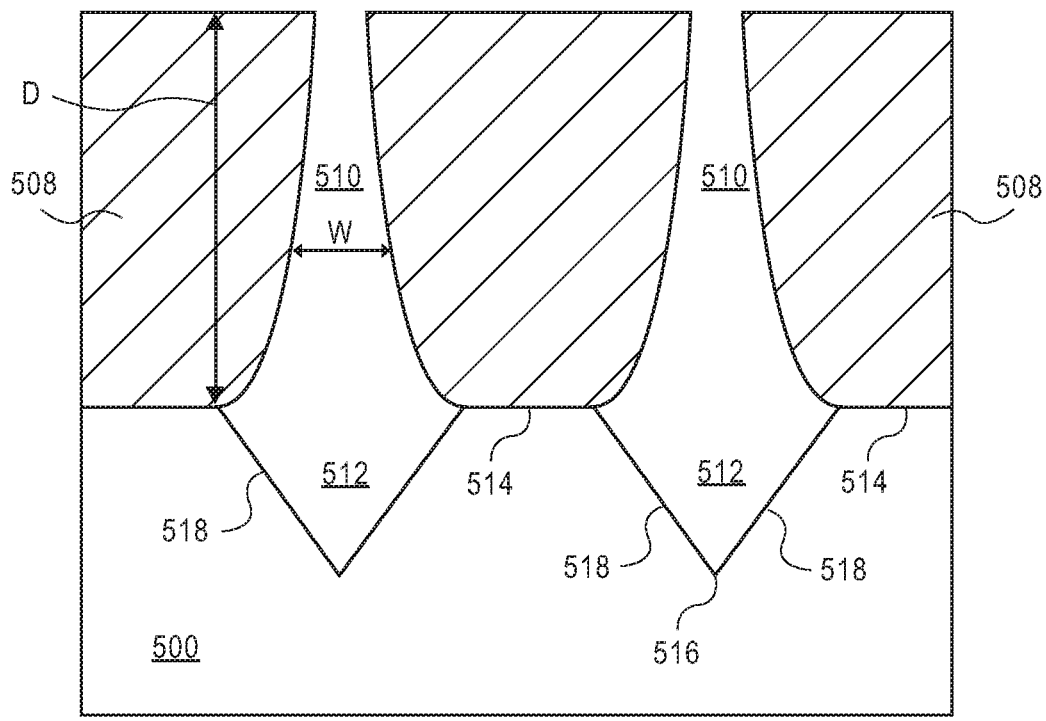

Next, as shown in FIG. 5D, sacrificial fins 504 are removed to create aspect ratio trapping (ART) trenches 510 in insulation layer 508. ART trenches 510 have an aspect ratio (depth (D):width (W)) in the insulation layer sufficient to provide aspect ratio trapping of dislocations or defects, such as threading dislocations, created during the subsequent deposition of a subfin semiconductor material or materials. In an embodiment of the present invention, ART trenches 510 have an aspect ratio of at least 2:1, generally at least 3:1, and ideally greater than 4:1.

In an embodiment of the present invention, a portion of the semiconductor substrate 500 beneath each ART trench 510 is removed to create a substrate trench 512 in the substrate 500, below the interface 514 between the bottom of insulation layer 508 and the top of substrate 500. In an embodiment, substrate trenches 512 have a "V" shaped profile with the widest part of the trench at the interface 514 and a vertex 516 deeper into the substrate. In an embodiment, the sidewalls 518 of the substrate trench are facets or planes of a monocrystalline semiconductor substrate. In a specific embodiment, they are the <111> planes of a (100) silicon monocrystalline substrate or wafer. In an embodiment, the bottom 516 of substrate trench 512 is between 10 and 30 nanometers below interface 514. Any well-known etching techniques, such as as plasma etching or wet etching, may be utilized to remove sacrificial fin 504 and a portion of the substrate to create a substrate trench 512. In an embodiment of the present invention, a dry etch is utilized to remove sacrificial fin 510 and a portion of substrate 500 and then a wet etch, such as tetramethyl ammonium hydroxide (TMAH), is utilized to create faceted sidewalls 518 in substrate 500.

Figure 5E:
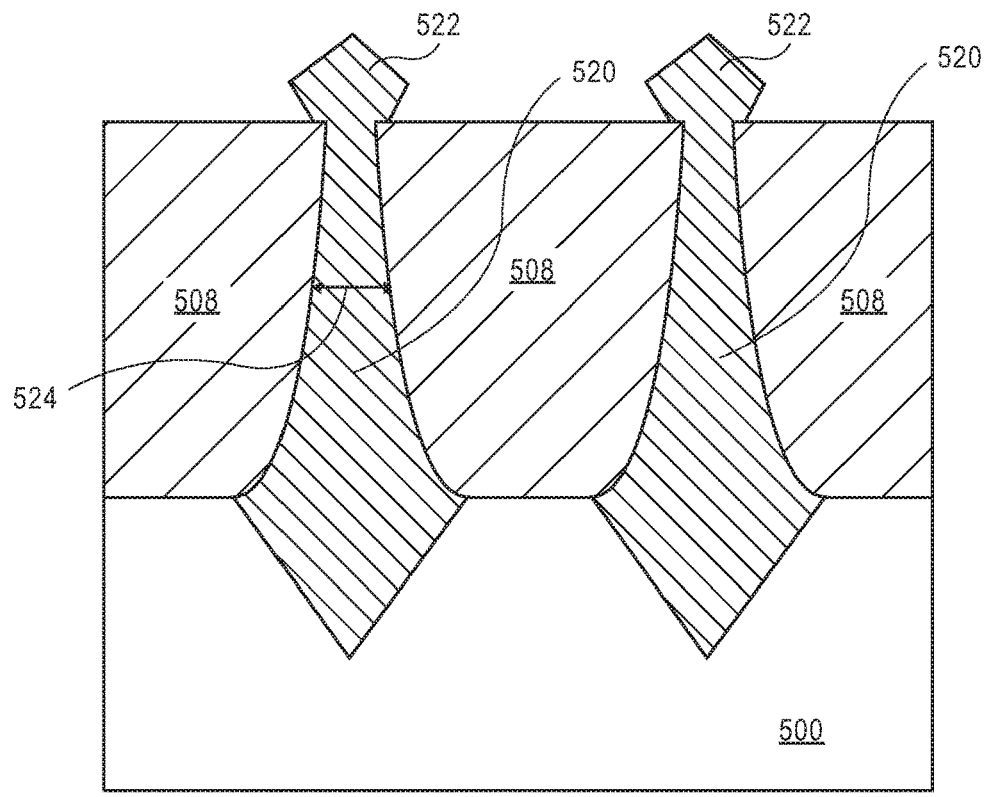

Next, as shown in FIG. 5E, a subfin semiconductor material 520 is formed in the ART trenches 510 and substrate trench 518 (if utilized). In an embodiment, subfin semiconductor material 520 is deposited until it completely fills trenches 510 and has portions 522 which extend above the top surface of insulation layer 508 as shown in FIG. 5E. In an embodiment, the subfin semiconductor material 520 is epitaxially grown by any well-known process, such as metal organic chemical vapor deposition (MOCVD) or molecular beam epitaxy (MBE). As the epitaxial semiconductor material grows from the bottom of the trench upward, defects substantially terminate, or completely terminate at a termination height 524 on the sidewalls of the trench. Accordingly, any portion of the subfin semiconductor material 520 above the termination height 524 is defect free or essentially defect free. In an embodiment of the present invention, subfin semiconductor material is a semiconductor material different than the semiconductor material from which the semiconductor substrate 500 is formed. In an embodiment of the present invention, the subfin semiconductor material 520 is a III-V semiconductor material, such as but not limited to GaAs, AlAs, GaAsP or GaInP. In an embodiment of the present invention, the subfin semiconductor material 520 may be a composite material including multiple layers of different semiconductor materials in order to provide buffer layers, grading or specific electrical characteristics, such as insulation.

Figure 5F:
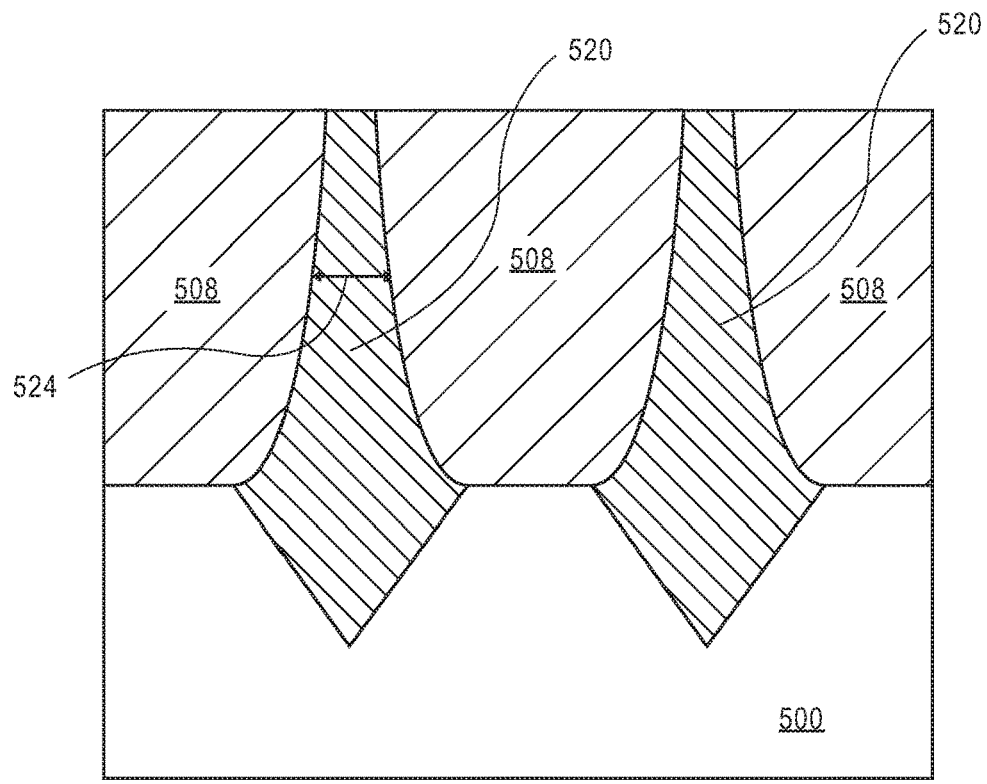

The portion 522 of subfin semiconductor material 520 extending above the top surface of insulation layer 508 may be removed. In an embodiment of the present invention, the portion 522 of the subfin semiconductor material 520 is removed by the planarization process, such as chemical mechanical polishing. The planarization process results in the subfin semiconductor material 520 having a top surface which is substantially coplanar with the top surface of insulation layer 508, as illustrated in FIG. 5F.

Figure 5G:
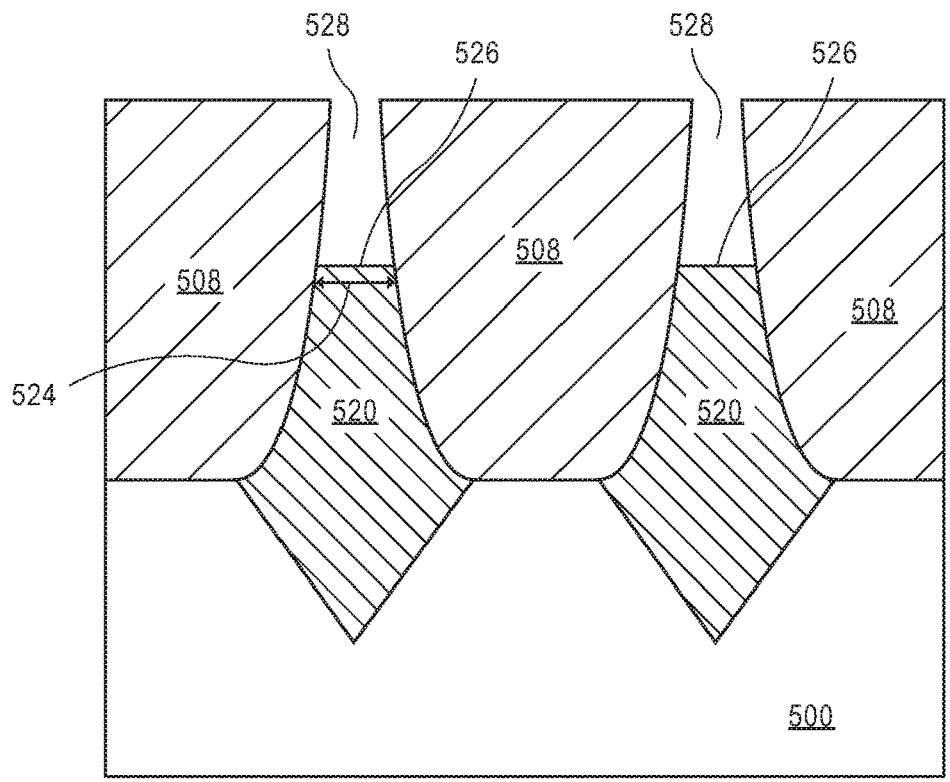

Next, as illustrated in FIG. 5G, subfin semiconductor material 520 is recessed down below the top surface of insulation layer 508. In an embodiment, subfin semiconductor material 520 is recessed to a level so that the top surface 526 is above the height 524 at which the dislocations in semiconductor material 520 have been substantially or completely eliminated. In this way, the top surface 526 of recessed semiconductor material 524 is pristine and substantially or completely defect free. In an embodiment, the extent of the recess of subfin semiconductor material 520 determines the ultimate height of an active fin portion, which may be formed according to the processing described below in association with FIGS. 5H and 5I.

Figure 5H:
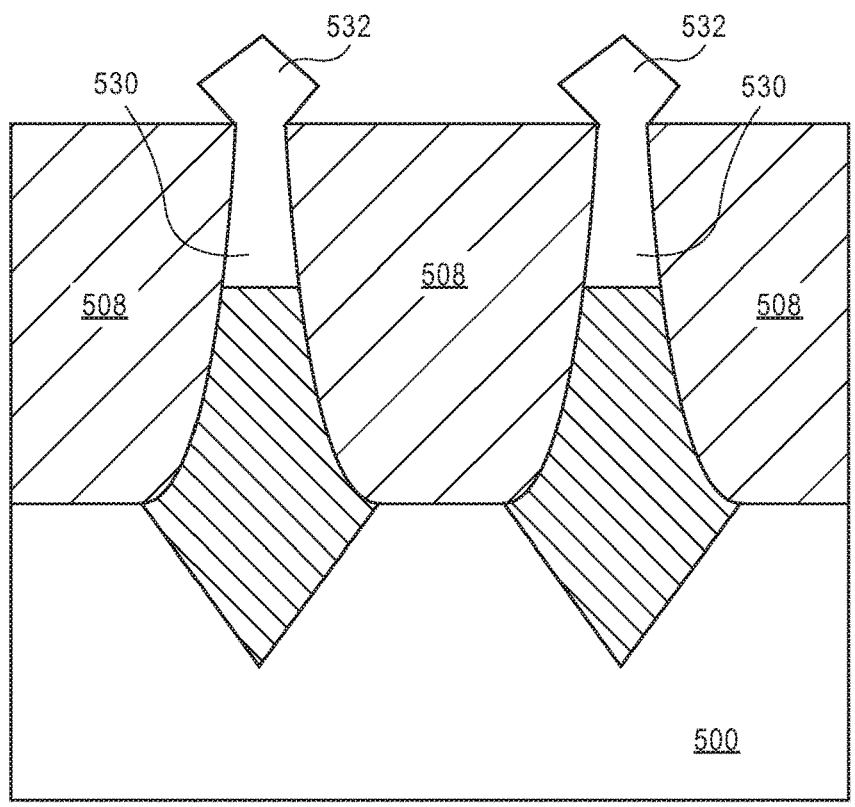

Next, as illustrated in FIG. 5H, an active fin semiconductor material 530 is grown in the recesses 528. In an embodiment, the active fin semiconductor material 530 is epitaxially grown by, for example, MOCVD or MBE from the pristine top surface 526 of subfin semiconductor material 520. In an embodiment of the present invention, active fin semiconductor material is epitaxially grown to have a portion 532 which extends above the top surface of insulation layer 508. In an embodiment, the portion of active fin semiconductor material 532 above the surface of insulation layer 508 is faceted. In an embodiment of the present invention, active fin semiconductor material 530 is lattice matched with the top surface 526 of subfin semiconductor material 524 so that active fin semiconductor material 530 is substantially or completely defect free. In an embodiment of the present invention, the active fin semiconductor material 530 is a group IV semiconductor, such as Ge or SiGe.

Figure 5I:
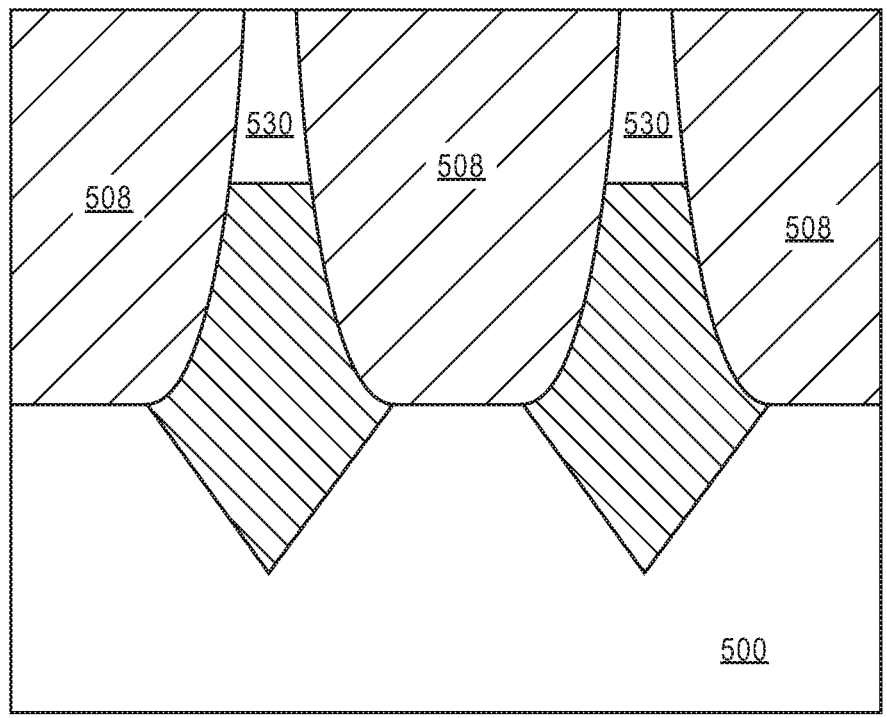

The portion 532 of active fin semiconductor material 530 extending above the top surface of insulation layer 508 may be removed. In an embodiment of the present invention, the portion 532 of the active fin semiconductor material 530 is removed by the planarization process, such as chemical mechanical polishing. The planarization process results in the active fin semiconductor material 530 having a top surface which is substantially coplanar with the top surface of insulation layer 508, as illustrated in FIG. 5I. It is to be appreciated that a height of the active fin portion may be reduced if the planarization process is continued below the top surface of insulation layer 508.

Figure 5J:
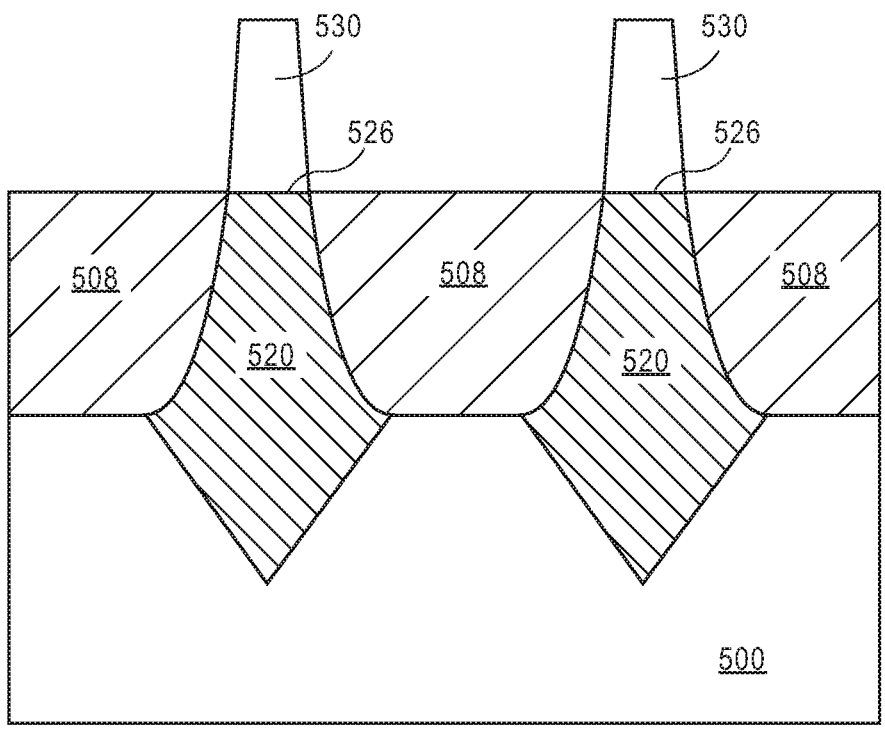

Next, as illustrated in FIG. 5J, the top surface of insulation layer 508 is recessed to reveal the sidewalls of active fin semiconductor material 530. In an embodiment of the present invention, the top of insulation layer 508 is recessed to a level that is substantially coplanar with the top surface 526 of subfin semiconductor material 520. In an embodiment of the present invention, the top of insulation layer 508 may be slightly recessed further than the top surface 526 of the subfin semiconductor material 520, if desired, in order to create a fin that has a slightly exposed subfin material as shown in FIG. 1C.

Figure 5K:
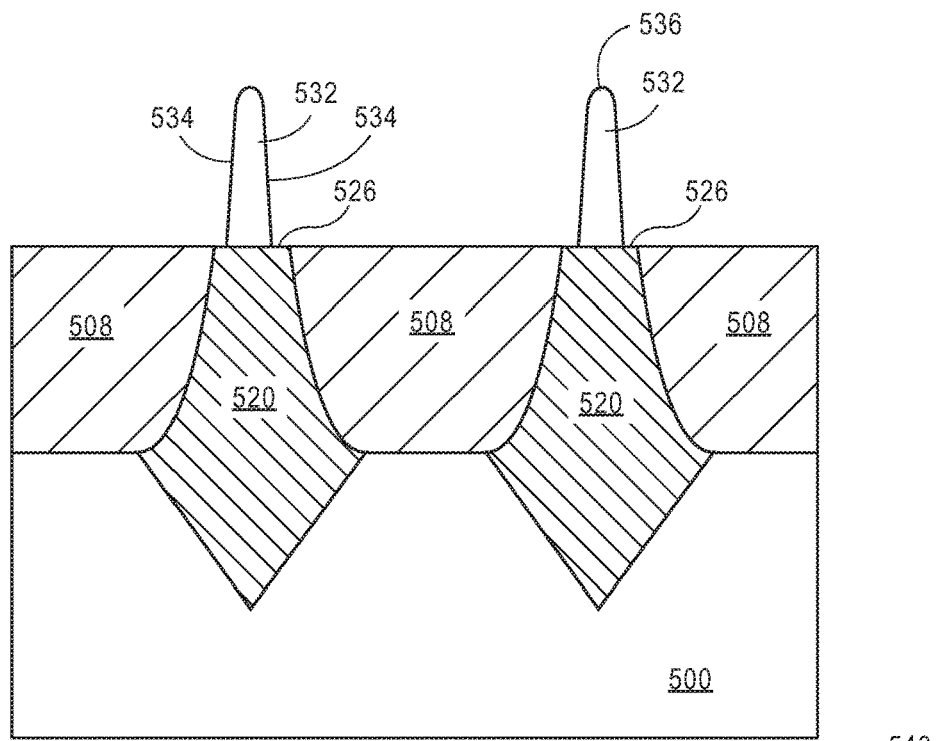

Next, as shown in FIG. 5K, the active fin semiconductor material 530 is laterally etched to create a thinned active fin semiconductor material 532. In an embodiment of the present invention, the active fin semiconductor material 530 is laterally etched using an etchant. In an embodiment, the active fin semiconductor material is isotropically etched utilizing a wet etchant, e.g., a wet etchant including $H_2O_2$/ HCl is used to etch germanium. In an embodiment, the active fin semiconductor is laterally etched to form a thinned active fin semiconductor 532 having a mid-point width of about 10-70% of the mid-point width of the active fin 530 prior to etching. In an embodiment of the present invention, the active fin semiconductor material 530 has a mid-point width between 10-30 nanometers while the thinned active semiconductor material 532 has a mid-point width of about 5-15 nanometers. In an embodiment, laterally etching the active fin 530 semiconductor creates a thinned active fin semiconductor material 532 which has a maximum width which is less than the width of the top surface of subfin semiconductor material 520.

Figure 5L:
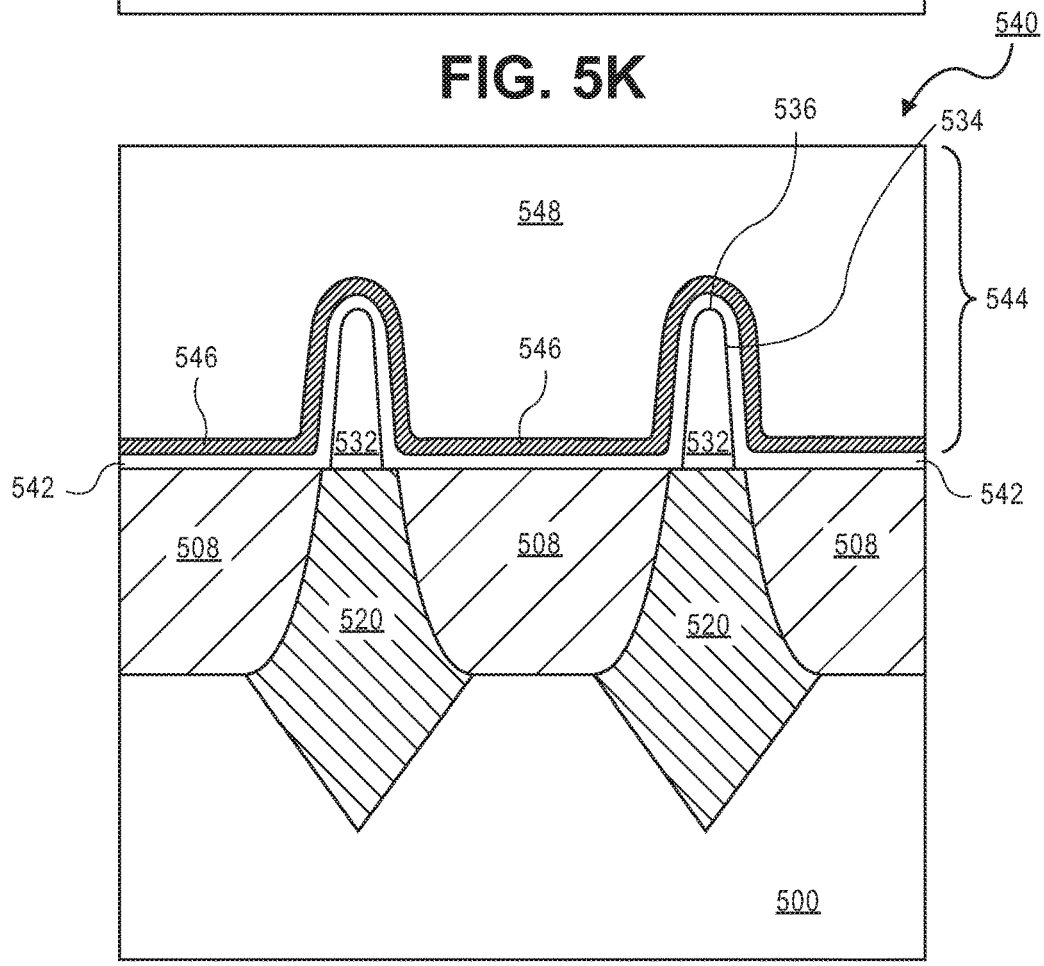

Next, as illustrated in FIG. 5L, a gate stack 540 is formed on the sidewalls 534 and the top 536 of thinned active fin semiconductor material 532. In an embodiment, the gate stack 540 includes a gate dielectric layer 542, such a high-k gate dielectric, and a gate electrode 544. The gate dielectric 542 is formed between the gate electrode 544 and thinned active fin semiconductor 532. In an embodiment, the gate electrode 544 includes one or more work function metals 546 and a fill metal 548. Source and drain regions (not shown) are formed on either side of the gate stack 540. In an embodiment of the present invention, the gate stack 540 is formed after creating the source and drain region and is formed utilizing a replacement gate process. In a replacement gate process, a sacrificial gate is first formed over the active fin semiconductors 532, spacers are then formed along the laterally opposite sidewalls of the sacrificial gate electrode and then an insulation layer formed adjacent to the spacers. The sacrificial gate electrode is then removed to expose the channel region of the active fin semiconductor 532, and the gate dielectric and gate electrode are then formed in the opening.

As an alternative to FIG. 5L, in an embodiment, prior to gate 540 formation an interlayer dielectric material may first be formed over thinned active fin semiconductor material 532. The interlayer dielectric material may then be planarized to reveal only the tops of the thinned active fin semiconductor material 532, which may be used for planar device fabrication, as described above in association with FIG. 3. As another alternative to FIG. 5L, prior to gate stack 540 formation, an upper portion of the active fin portion is made to be discrete from the remainder of the underlying fin, thus providing a nanowire channel region. The gate electrode may then be formed to surround the nanowire channel region, as described above in association with FIG. 4.

In another embodiment, the operations described in association with FIGS. 5G and 5H may be performed to first recess only some regions of the subfin semiconductor material 520 and not others, and then to regrow a first semiconductor material in the recessed regions. Next, the other regions of the subfin semiconductor material 520 are recessed and a second, different, semiconductor material is grown in order to provide differentiated devices having different active fin semiconductor materials, such as P-type and N-type devices formed on a same substrate, as was described in association with FIG. 2.

It is to be appreciated that further fabrication operations may include contact formation to source, drain, and gate structures, and interconnection of the resulting transistors into back end of line metallization layers. It is also to be appreciated that a single device may be fabricated from a single ultra thin fin or from a plurality of ultra thin fins. That is, a gate electrode may be formed over one or more than one of the ultra thin fins.

Figure 6:
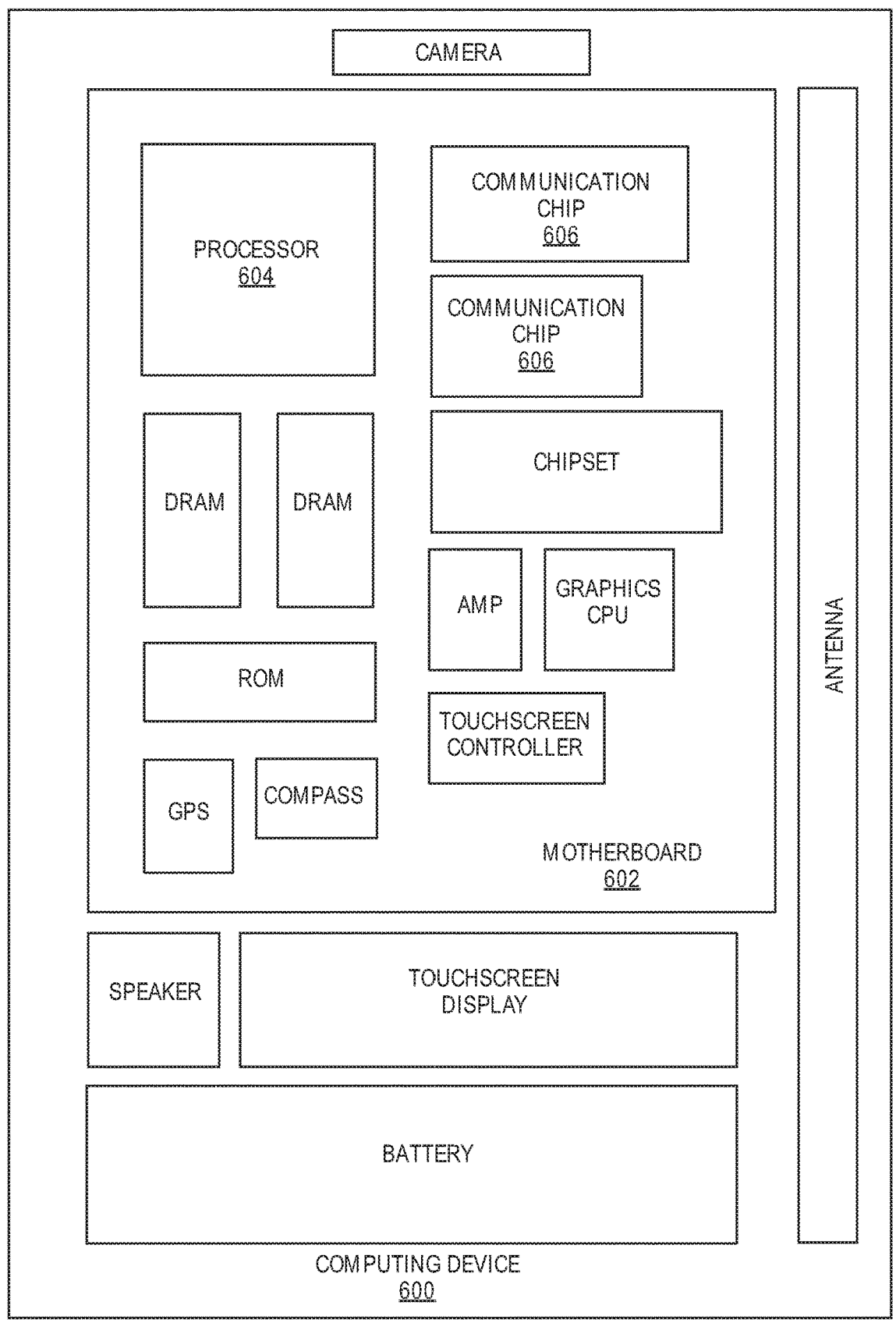
FIG. 6 illustrates a computing device in accordance with one implementation of an embodiment of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as field effect transistors built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as FET transistors built in accordance with implementations of the invention.

In further implementations, another component housed within the computing device 300 may contain an integrated circuit die that includes one or more devices, such as FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Figure 7:
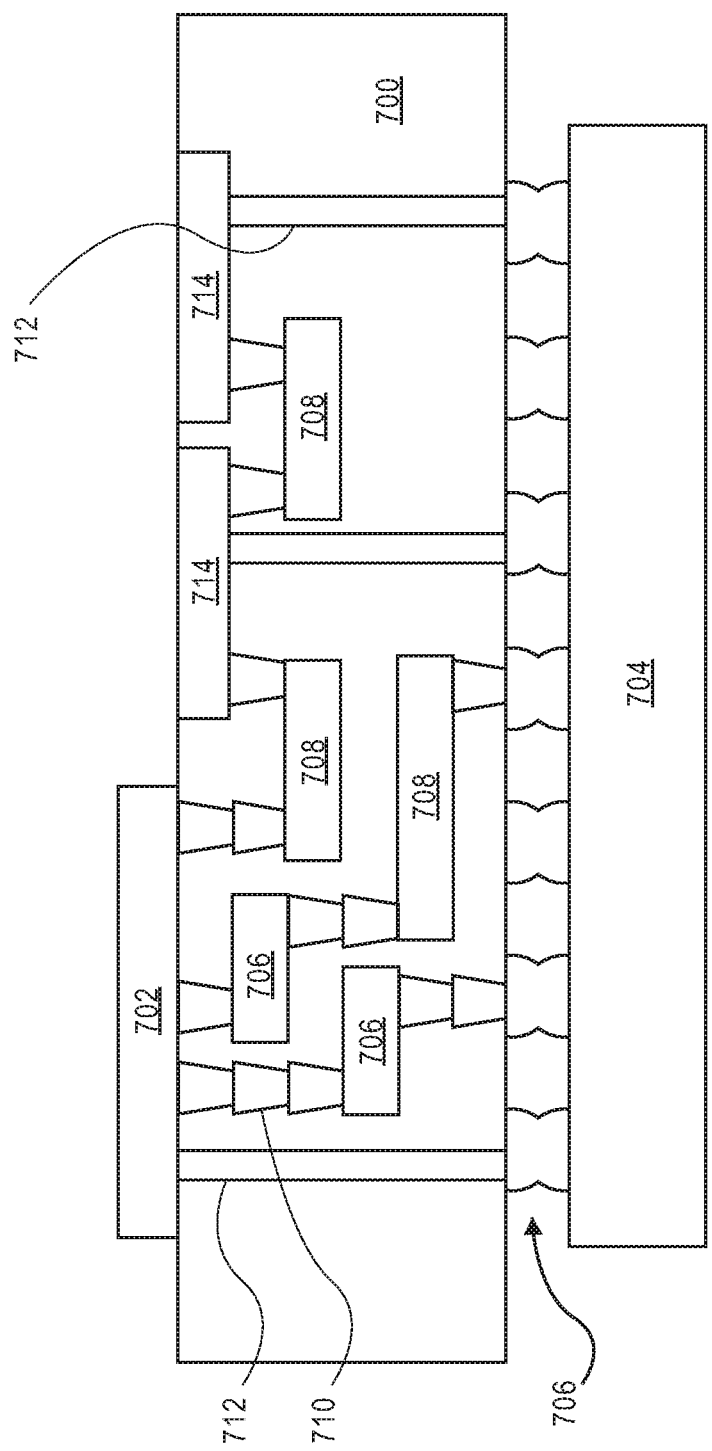
FIG. 7 is an interposer implementing one or more embodiments of the invention.

FIG. 7 illustrates an interposer 700 that includes one or more embodiments of the invention. The interposer 700 is an intervening substrate used to bridge a first substrate 702 to a second substrate 704. The first substrate 702 may be, for instance, an integrated circuit die. The second substrate 704 may be, for instance, a memory module, a computer motherboard, or another integrated circuit die. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700. In accordance with embodiments of the invention, apparatuses or processes disclosed herein may be used in the fabrication of interposer 700.

Embodiments of the present invention are directed to field effect transistors having ultra thin fin profiles and their methods of fabrication.

In an embodiment, an integrated circuit includes a semiconductor substrate. An insulation layer is formed on the semiconductor substrate. A fin extends from the semiconductor substrate, the fin having a subfin portion on the semiconductor substrate and an active fin portion on the subfin portion, the subfin portion disposed in a trench formed in the insulation layer, the subfin portion comprising a III-V semiconductor material and the active fin portion comprising a group IV semiconductor material.

In one embodiment, the III-V semiconductor material is GaAs and wherein the group IV semiconductor material is germanium.

In one embodiment, the semiconductor substrate is a monocrystalline silicon substrate.

In one embodiment, the active fin portion has a top and sidewalls extending above the insulation layer.

In one embodiment, the active fin portion has a top active fin portion and a bottom active fin portion and wherein the subfin portion has a top subfin portion and a bottom subfin portion in the trench in the insulation layer wherein the bottom of the active fin portion is disposed directly on the top of a subfin portion and wherein the bottom of the active fin portion has a smaller width than the top of the subfin portion.

In one embodiment, the width of the bottom of the subfin is greater than the width of the top of the subfin.

In one embodiment, the subfin further includes a "V" shaped portion extending into the semiconductor substrate and below the insulation layer.

In one embodiment, the integrated circuit further includes a gate structure formed on the active fin portion, and a source region and a drain region disposed on opposite sides of the gate structure.

In one embodiment, the gate structure comprises a gate dielectric layer formed on the active fin portion and a gate electrode formed on the gate dielectric layer.

In one embodiment, the integrated circuit further includes a second fin extending from the semiconductor substrate, the second fin having a second subfin portion on the semiconductor substrate and a second active fin portion on the second subfin portion, the second subfin portion disposed in a second trench disposed in the insulation layer, the second trench having an aspect ratio (depth to width) of at least 2:1, the second subfin portion comprising the III-V semiconductor material, the second active fin portion comprising a second III-V semiconductor material different than the III-V semiconductor material.

In an embodiment, a method of forming an integrated circuit includes forming a trench in an insulation layer disposed on a semiconductor substrate, the trench having an aspect ratio of at least 2:1 at the largest width of the trench. A III-V semiconductor material is formed in the trench and above a top surface of the insulation layer. The III-V semiconductor material that extends over the trench is planarized to a level generally coplanar with the top surface of the insulation layer. The III-V semiconductor material is recessed in the trench so that the III-V semiconductor material has a top surface lower than the top surface of the insulation layer. A group IV semiconductor material is formed on the III-V semiconductor material in the trench and extending above the top surface of the insulation layer. The portion of a group IV semiconductor material that extends over the trench is planarized to a level generally coplanar with the top surface of the shallow trench insulation. The shallow trench insulation is recessed so that the group IV semiconductor has a top and sidewalls extending above the recessed top surface of the insulation layer to form an active fin portion. The sidewalls of the active fin portion are thinned to create a thinned active fin portion.

In one embodiment, the maximum width between the sidewalls of the thinned active fin portion is between 5-50% of the maximum width between the sidewalls of the active fin portion prior to thinning.

In one embodiment, forming the trench in the insulation layer includes forming a sacrificial fin from the semiconductor substrate, forming the insulation layer over and around the sacrificial fin, polishing the insulation layer so that is it substantially planar with the sacrificial fin and removing the sacrificial fin to create the trench in the insulation layer.

In one embodiment, forming the fin comprises etching the semiconductor fin from the semiconductor fin from the semiconductor substrate such that the fin has a top and a bottom wherein the bottom is wider than the top.

In one embodiment, the method further includes forming a gate stack on the top and sidewalls of the thinned active fin portion.

In one embodiment, forming the gate stack comprises forming a gate dielectric on the top and sidewalls on the thinned active fin region and forming a gate electrode on the gate dielectric layer.

In one embodiment, the method further includes, after forming the trench in the insulation layer, etching the semiconductor substrate to form a "V" shaped opening in the semiconductor substrate located below the insulation layer.

In an embodiment, a device includes a semiconductor substrate. An insulation layer is disposed on the semiconductor substrate. A trench is disposed in the insulation layer. A fin having an active fin portion is disposed on a subfin portion, the subfin portion having a lower portion formed in a faceted notch in the substrate below the insulation layer and an upper portion disposed in the trench in the insulation layer wherein the width the upper portion of the subfin portion at the bottom of the trench is wider than the width of the upper portion of the subfin at the top of the insulation layer. The subfin portion comprises a III-V semiconductor material. The active fin portion comprises a semiconductor material different from the III-V semiconductor material of the subfin portion.

In one embodiment, the III-V semiconductor material of the subfin portion is selected from the group consisting of GaAs and GaAsP, and the semiconductor material of the active fin portion is selected from the group consisting of germanium and SiGe.

In one embodiment, the active fin portion comprises a III-V semiconductor material.

In one embodiment, the active fin portion has a top and sidewalls which extend above the top surface of the insulation layer.

In one embodiment, the device further includes a gate stack formed on the active fin portion.

We claim:

1. An integrated circuit comprising:
    a semiconductor substrate;
    an insulation layer formed on the semiconductor substrate, the insulation layer having a top surface; and
    a fin extending from the semiconductor substrate, the fin having a subfin portion on the semiconductor substrate and an active fin portion on the subfin portion, the subfin portion disposed in a trench formed in the insulation layer, the subfin portion comprising a III-V semiconductor material and the active fin portion comprising a group IV semiconductor material, wherein the active fin portion has a top active fin portion and a bottom active fin portion, and the top of the active fin portion has a smaller width than the bottom active fin portion, and wherein the bottom active fin portion is above the top surface of the insulation layer.

2. The integrated circuit of claim 1 wherein the III-V semiconductor material is GaAs and wherein the group IV semiconductor material is germanium.

3. The integrated circuit of claim 2 wherein the semiconductor substrate is a monocrystalline silicon substrate.

4. The integrated circuit of claim 1 wherein the active fin portion has a top and sidewalls extending above the insulation layer.

5. The integrated circuit of claim 4 wherein the subfin portion has a top subfin portion and a bottom subfin portion in the trench in the insulation layer wherein the bottom active fin portion is disposed directly on the top of a subfin portion and wherein the bottom active fin portion has a smaller width than the top subfin portion.

6. The integrated circuit of claim 5 wherein the width of the bottom of the subfin portion is greater than the width of the top of the subfin portion.

7. The integrated circuit of claim 1 wherein the subfin further comprises a "V" shaped portion extending into the semiconductor substrate and below the insulation layer.

8. The integrated circuit of claim 1 further comprising a gate structure formed on the active fin portion; and a source region and a drain region disposed on opposite sides of the gate structure.

9. The integrated circuit of claim 8 wherein the gate structure comprises a gate dielectric layer formed on the active fin portion and a gate electrode formed on the gate dielectric layer.

10. The integrated circuit of claim 1 further comprising a second fin extending from the semiconductor substrate, the second fin having a second subfin portion on the semiconductor substrate and a second active fin portion on the second subfin portion, the second subfin portion disposed in a second trench disposed in the insulation layer, the second trench having an aspect ratio (depth to width) of at least 2:1, the second subfin portion comprising the III-V semiconductor material, the second active fin portion comprising a second III-V semiconductor material different than the III-V semiconductor material.

11. A method of forming an integrated circuit comprising:
  forming a trench in an insulation layer disposed on a semiconductor substrate, the trench having an aspect ratio of at least 2:1 at the largest width of the trench;
  forming a III-V semiconductor material in the trench and above a top surface of the insulation layer;
  planarizing the III-V semiconductor material that extends over the trench to a level generally coplanar with the top surface of the insulation layer;
  recessing the III-V semiconductor material in the trench so that the III-V semiconductor material has a top surface lower than the top surface of the insulation layer;
  forming a group IV semiconductor material on the III-V semiconductor material in the trench and extending above the top surface of the insulation layer;
  planarizing the portion of a group IV semiconductor material that extends over the trench to a level generally coplanar with the top surface of the insulation layer;
  recessing the insulation layer so that the group IV semiconductor has a top and sidewalls extending above the recessed top surface of the insulation layer to form an active fin portion; and thinning the sidewalls of the active fin portion to create a thinned active fin portion.

12. The method of forming an integrated circuit of claim 11 wherein the maximum width between the sidewalls of the thinned active fin portion is between 5-50% of the maximum width between the sidewalls of the active fin portion prior to thinning.

13. The method of forming an integrated circuit of claim 11 wherein forming the trench in the insulation layer comprises:
  forming a sacrificial fin from the semiconductor substrate;
  forming the insulation layer over and around the sacrificial fin;
  polishing the insulation layer so that is it substantially planar with the sacrificial fin; and
  removing the sacrificial fin to create the trench in the insulation layer.

14. The method of forming an integrated circuit of claim 13 wherein forming the fin comprises etching the semiconductor fin from the semiconductor fin from the semiconductor substrate such that the fin has a top and a bottom wherein the bottom is wider than the top.

15. The method of forming an integrated circuit of claim 11 further comprising forming a gate stack on the top and sidewalls of the thinned active fin portion.

16. The method of forming an integrated circuit of claim 15 wherein forming the gate stack comprises forming a gate dielectric on the top and sidewalls on the thinned active fin region and forming a gate electrode on the gate dielectric layer.

17. The method of forming an integrated circuit of claim 11 further comprising:
  after forming the trench in the insulation layer, etching the semiconductor substrate to form a "V" shaped opening in the semiconductor substrate located below the insulation layer.

18. A device comprising: a semiconductor substrate:
  an insulation layer disposed on the semiconductor substrate, the insulation layer having a top surface;
  a trench disposed in the insulation layer;
  a fin having an active fin portion disposed on a subfin portion, the subfin portion having a lower portion formed in a faceted notch in the substrate below the insulation layer and an upper portion disposed in the trench in the insulation layer wherein the width upper portion of the subfin portion at the bottom of the trench is wider than the width of the upper portion of the subfin at the top of the insulation layer, wherein the subfin portion comprises a III-V semiconductor material and wherein the active fin portion comprises a semiconductor material different from the III-V semiconductor material of the subfin portion, and wherein the active fin portion has a top active fin portion and a bottom active fin portion, and the top of the active fin portion has a smaller width than the bottom active fin portion, and wherein the bottom active fin portion is above the top surface of the insulation layer.

19. The device of claim 18 wherein the III-V semiconductor material of the subfin portion is selected from the group consisting of GaAs and GaAsP, and the semiconductor material of the active fin portion is selected from the group consisting of germanium and SiGe.

20. The device of claim 18 wherein the active fin portion comprises a III-V semiconductor material.

21. The device of claim 18 wherein the active fin portion has a top and sidewalls which extend above the top surface of the insulation layer.

22. The device of claim 18 further comprising a gate stack formed on the active fin portion.

23. An integrated circuit comprising:
a semiconductor substrate;
an insulation layer formed on the semiconductor substrate;
a fin extending from the semiconductor substrate, the fin having a subfin portion on the semiconductor substrate and an active fin portion on the subfin portion, the subfin portion disposed in a trench formed in the insulation layer, the subfin portion comprising a III-V semiconductor material and the active fin portion comprising a group IV semiconductor material; and
a second fin extending from the semiconductor substrate, the second fin having a second subfin portion on the semiconductor substrate and a second active fin portion on the second subfin portion, the second subfin portion disposed in a second trench disposed in the insulation layer, the second trench having an aspect ratio (depth to width) of at least 2:1, the second subfin portion comprising the III-V semiconductor material, the second active fin portion comprising a second III-V semiconductor material different than the III-V semiconductor material.

24. An integrated circuit comprising:
a semiconductor substrate;
an insulation layer formed on the semiconductor substrate; and
a fin extending from the semiconductor substrate, the fin having a subfin portion on the semiconductor substrate and an active fin portion on the subfin portion, the subfin portion disposed in a trench formed in the insulation layer, the subfin portion comprising a III-V semiconductor material and the active fin portion comprising a group IV semiconductor material, wherein the active fin portion has a top active fin portion and a bottom active fin portion, and the top of the active fin portion has a smaller width than the bottom active fin portion, wherein the active fin portion has a top and sidewalls extending above the insulation layer, and wherein the subfin portion has a top subfin portion and a bottom subfin portion in the trench in the insulation layer wherein the bottom active fin portion is disposed directly on the top of a subfin portion and wherein the bottom active fin portion has a smaller width than the top subfin portion.

25. The integrated circuit of claim 24 wherein the width of the bottom of the subfin portion is greater than the width of the top of the subfin portion.

* * * * *